United States Patent

Petty et al.

[11] Patent Number: 6,157,546
[45] Date of Patent: Dec. 5, 2000

[54] SHIELDING APPARATUS FOR ELECTRONIC DEVICES

[75] Inventors: John S. Petty, Chapel Hill; William Tolbert, Durham, both of N.C.; Robert Ray Horton, Pueblo West, Colo.; Randy Morse Villeneuve, Amherst, Va.

[73] Assignee: Ericsson Inc., Research Triangle Park, N.C.

[21] Appl. No.: 09/277,675

[22] Filed: Mar. 26, 1999

[51] Int. Cl.[7] ....................................................... H05K 9/00
[52] U.S. Cl. .......................... 361/816; 361/753; 361/799; 361/800; 174/35 R; 174/51
[58] Field of Search .................................... 361/683, 728, 361/736, 737, 752, 753, 796, 799, 800, 816, 818; 174/35 R, 35 GC, 51; 906/719

[56] References Cited

U.S. PATENT DOCUMENTS

| | | | |
|---|---|---|---|
| 4,370,528 | 1/1983 | Aschenbach | 200/6 BB |
| 4,385,209 | 5/1983 | Greason et al. | 179/111 E |
| 4,554,400 | 11/1985 | Schmalzl | 174/35 GC |
| 4,564,722 | 1/1986 | Nordin | 174/35 GC |
| 4,567,317 | 1/1986 | Ehrlich et al. | 174/35 MS |
| 4,609,104 | 9/1986 | Kasper et al. | 206/334 |
| 4,663,565 | 5/1987 | Novajovsky | 315/39.51 |
| 4,675,139 | 6/1987 | Kehe et al. | 264/26 |
| 4,681,712 | 7/1987 | Sakakibara et al. | 264/24 |
| 4,718,215 | 1/1988 | Carveth et al. | 53/410 |
| 4,731,286 | 3/1988 | Yamashita et al. | 428/329 |
| 4,749,972 | 6/1988 | Schulz et al. | 333/167 |
| 4,762,966 | 8/1988 | Kosanda | 174/35 GC |
| 4,773,091 | 9/1988 | Busche et al. | 379/433 |
| 4,774,914 | 10/1988 | Ward | 123/162 |
| 4,780,570 | 10/1988 | Chuck | 174/35 GC |
| 4,788,381 | 11/1988 | Nilsson | 174/35 GC |
| 4,800,464 | 1/1989 | Roos et al. | 361/816 |
| 4,817,337 | 4/1989 | Lahita | 49/483 |
| 4,831,210 | 5/1989 | Larson et al. | 174/35 MS |
| 4,851,609 | 7/1989 | Reddy | 174/35 R |
| 4,857,668 | 8/1989 | Buonanno | 174/35 GC |
| 5,027,426 | 6/1991 | Chiocca, Jr. | 455/5 |
| 5,030,118 | 7/1991 | Burks | 439/138 |
| 5,039,825 | 8/1991 | Samarov | 174/35 GC |
| 5,045,636 | 9/1991 | Johnasen et al. | 174/35 MS |
| 5,073,761 | 12/1991 | Waterman et al. | 333/24 C |
| 5,086,226 | 2/1992 | Marcus | 250/288 |
| 5,107,404 | 4/1992 | Tam | 361/424 |
| 5,124,889 | 6/1992 | Humbert et al. | 361/424 |
| 5,147,121 | 9/1992 | McIlwraith | 312/296 |
| 5,150,282 | 9/1992 | Tomura et al. | 361/816 |
| 5,196,814 | 3/1993 | Felker et al. | 333/254 |

(List continued on next page.)

FOREIGN PATENT DOCUMENTS

| | | |
|---|---|---|
| 0 504 020 A1 | 9/1992 | European Pat. Off. . |
| 0 756 446 A1 | 1/1997 | European Pat. Off. . |
| 0 806 891 A1 | 11/1997 | European Pat. Off. . |

OTHER PUBLICATIONS

Brochure, "Gore's new SMT EMI Gaskets," W.L. Gore & Associates, Inc., Copyright 1999.

Brochure, "Gore Introduces a New Innovation in EMI Gasketing Aimed at Lower Cost and Reduced Installation Time at the PCS '99 Show, Booth 3012, in New Orleans!" W.L. Gore & Associates, Inc.

*Primary Examiner*—Jayprakash N. Gandhi
*Attorney, Agent, or Firm*—Myers Bigel Sibley & Sajovec, P.A.

[57] ABSTRACT

Electromagnetic shielding devices are provided that can be easily modified in shape and configuration to facilitate electronic device development. An electronic substrate includes a surface and a ground trace extending along the surface to define a perimeter of an area of the electronic substrate to be shielded. A plurality of electrically conductive block members are electrically secured to the ground trace in adjacent relationship. An electrically conductive cover is electrically secured to a top face of each of the block members to overlie the area of the electronic surface to be shielded.

49 Claims, 4 Drawing Sheets

U.S. PATENT DOCUMENTS

| | | | |
|---|---|---|---|
| 5,231,967 | 8/1993 | Baltz et al. | 123/497 |
| 5,323,299 | 6/1994 | Weber | 361/818 |
| 5,325,021 | 6/1994 | Duckworth et al. | 315/111.51 |
| 5,369,701 | 11/1994 | McAteer et al. | 379/420 |
| 5,373,555 | 12/1994 | Norris et al. | 379/430 |
| 5,391,083 | 2/1995 | Roebuck et al. | 439/76 |
| 5,439,021 | 8/1995 | Burlage et al. | 137/84 |
| 5,473,117 | 12/1995 | Morgan et al. | 174/78 |
| 5,495,399 | 2/1996 | Gore et al. | 361/814 |
| 5,513,071 | 4/1996 | LaViolette et al. | 361/703 |
| 5,513,078 | 4/1996 | Komrska et al. | 361/816 |
| 5,539,149 | 7/1996 | Gatti | 174/35 GC |
| 5,541,610 | 7/1996 | Imanishi et al. | 343/702 |
| 5,545,843 | 8/1996 | Arvidsson et al. | 175/35 GC |
| 5,550,713 | 8/1996 | Pressler et al. | 361/818 |
| 5,565,656 | 10/1996 | Mottahed | 174/35 GC |
| 5,566,055 | 10/1996 | Salvi, Jr. | 361/816 |
| 5,573,000 | 11/1996 | Goffer et al. | 128/653.2 |
| 5,613,221 | 3/1997 | Hunt | 455/89 |
| 5,640,457 | 6/1997 | Gnecco et al. | 381/69 |
| 5,651,701 | 7/1997 | Chen | 439/607 |
| 5,666,095 | 9/1997 | Namkung et al. | 333/259 |
| 5,748,254 | 5/1998 | Harrison et al. | 348/552 |
| 5,761,042 | 6/1998 | Widmayer et al. | 361/704 |
| 5,764,492 | 6/1998 | Ady et al. | 361/818 |
| 5,847,938 | 12/1998 | Gammon | 361/816 |
| 5,917,708 | 6/1999 | Moran et al. | 361/800 |

10,157,546

SHIELDING APPARATUS FOR ELECTRONIC DEVICES

FIELD OF THE INVENTION

The present invention relates generally to shielding and, more particularly, to devices for shielding electronic components and/or circuitry within electronic devices.

BACKGROUND OF THE INVENTION

Printed circuit boards (PCBs) are widely used electronic substrates in the electronics and telecommunications industry. PCBs generally include one or more layers of an insulating substrate (e.g., plastic) on which an electrical circuit is formed by depositing a predetermined pattern of a conducting metal (e.g., copper) for connecting various electronic components (e.g., semiconductors) which are mounted on or embedded in the PCB layers. Many of these electrical circuits include components which operate at a high radio frequency (RF). The RF emissions from these components can interfere with the proper operation of other components or circuits in the vicinity of the PCB. Thus, it may be important to block or shield these RF emissions in order to prevent RF interference.

For compact electronic devices, such as radiotelephones, a PCB serving as a ground plane may be utilized as a part of a shielding system. A conductive housing (often referred to as a "shield can") that is configured to surround all or part of a component is typically electrically connected to a PCB upon which the component is secured. An exemplary shield can that is electrically secured to a PCB is described in co-assigned U.S. Pat. No. 5,847,938.

Conventional shield cans can have somewhat complex shapes and configurations because of PCB space constraints within small electronic devices such as radiotelephones. Referring to FIG. 1, an exemplary shield can 10 with a somewhat complex configuration and that is configured to be secured to a PCB 12 over a plurality of electronic components 14 is illustrated. The illustrated shield can 10 includes a top 16 and a plurality of side walls 18 depending from the top 16.

During the development stage of an electronic device, such as a radiotelephone, the location, shape and/or size of electronic components and circuitry on a PCB therewithin may change. Accordingly, any such changes may require a change in the size and/or configuration of a device, such as a shield can, for shielding these components and circuitry. Unfortunately, changing the size and/or configuration of a shielding device during the development phase of an electronic device may lead to increased costs and may cause development delays. As a result, conventional shield cans that are molded or formed for a specific location and/or configuration may be unsuitable for use during the development stages of an electronic device.

SUMMARY OF THE INVENTION

In view of the above, it is therefore an object of the present invention to provide an RF shielding apparatus for shielding electronic components and circuitry mounted to a PCB within an electronic device that can be easily modified in shape and configuration during the development stage of the electronic device.

It is another object of the present invention to facilitate the use of shielding devices within electronic devices, such as radiotelephones, where PCB space may be limited.

It is another object of the present invention to facilitate reducing costs associated with electronic device development.

These and other objects of the present invention are provided by an electromagnetic shielding apparatus that can be easily modified in shape and configuration to facilitate electronic device development. An electromagnetic shielding apparatus, according to one embodiment of the present invention, includes an electronic substrate having a surface and a ground trace extending along the surface to define a perimeter of an area of the electronic substrate to be shielded. A plurality of electrically conductive block members are electrically secured to the ground trace in adjacent relationship. Each electrically conductive block member includes opposite front and back faces, a pair of opposite side faces, and generally parallel top and bottom faces. An electrically conductive cover is electrically secured to the top face of each of the block members to overlie the area of the electronic surface to be shielded.

The present invention can be advantageous during the development phase of electronic devices when the locations of electronic components and circuitry are being determined because the block members can be arranged on a PCB in virtually any desired pattern. Similarly, a cover can be fabricated with virtually any desired shape to overlie the block members so as to form an enclosure around an area of a PCB to be shielded.

According to another embodiment of the present invention, a groove may be formed in a bottom face of a block member so as to extend between the front and back faces thereof. Accordingly, a conductive trace can extend along a PCB through the groove and across the perimeter of the shielded area.

According to another embodiment of the present invention, a shielding apparatus may be incorporated into PCMCIA cards (also known as "PC cards"). A PCMCIA card includes a housing having an electrically conductive cover and a PCB disposed within the housing. The PCB includes a surface and a ground trace extending along the surface to define a perimeter of an area of the PCB to be shielded. A plurality of electrically conductive block members are electrically secured to the ground trace in adjacent relationship. The housing cover is electrically secured to a top face of each of the block members. The housing cover thus forms a shielding enclosure for the area of the PCB defined by the conductive blocks.

The present invention when utilized within a PCMCIA card can be advantageous over previous shielding methods utilizing PCMCIA card spring fingers. PCMCIA card spring fingers often have a tendency to deform the cover of a PCMCIA card. Furthermore, PCMCIA card spring fingers can be difficult to install with automated "pick and place" equipment.

BRIEF DESCRIPTION OF THE DRAWINGS

The accompanying drawings, which are incorporated in and constitute a part of the specification, illustrate embodiments of the invention and, together with the description, serve to explain principles of the invention.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Radiotelephones generally refer to communications terminals which provide a wireless communications link to one or more other communications terminals. Radiotelephones may be used in a variety of different applications, including cellular telephone, land-mobile (e.g., police and fire departments), and satellite communications systems.

Figure 1:
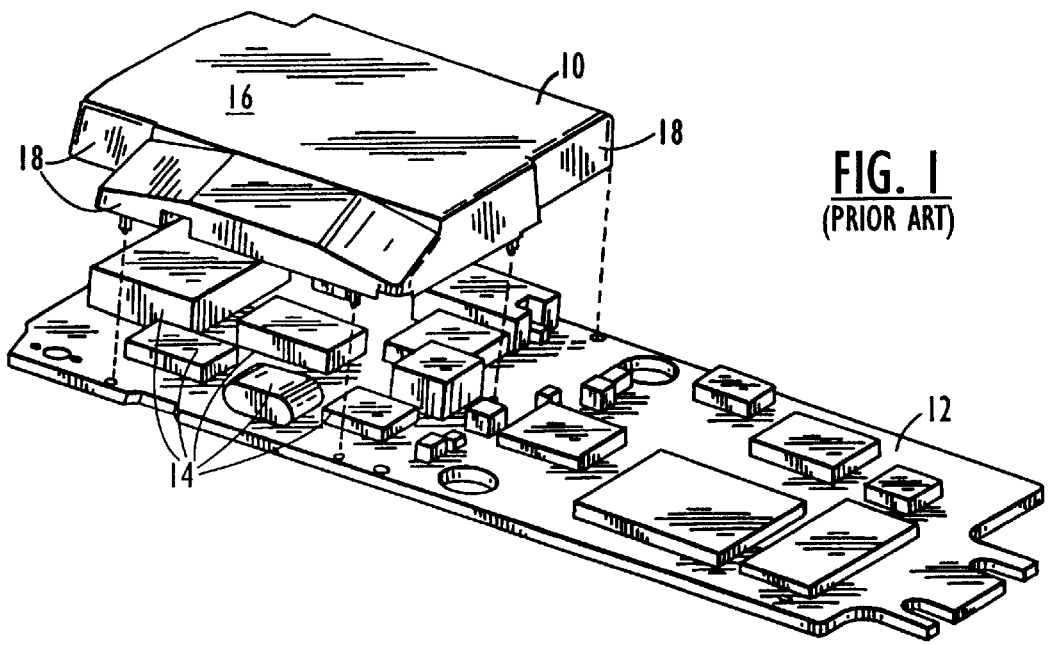
FIG. 1 illustrates an exemplary molded shield can having a somewhat complex configuration and that surrounds a plurality of electronic components on a PCB.
Figure 2:
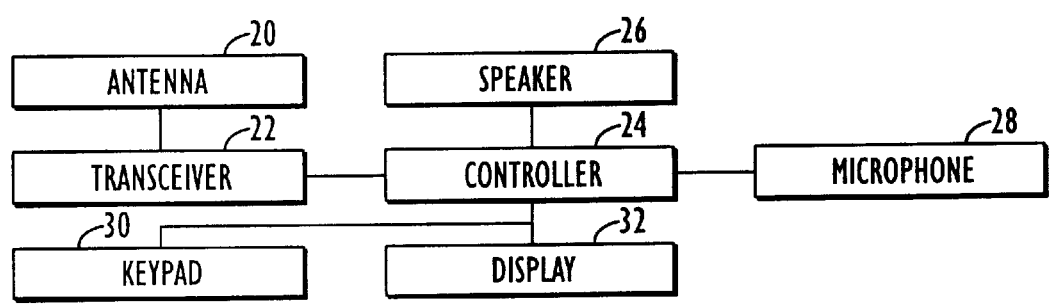
FIG. 2 schematically illustrates a conventional arrangement of electronic components that enable a radiotelephone to transmit and receive radiotelephone communications signals.

A conventional arrangement of electronic components that enable a radiotelephone to transmit and receive radiotelephone communication signals is shown schematically in FIG. 2, and is understood by those skilled in the art of radiotelephone communications. An antenna 20 for receiving and transmitting radiotelephone communication signals is electrically connected to a radio-frequency transceiver 22 that is further electrically connected to a controller 24, such as a microprocessor. The controller 24 is electrically connected to a speaker 26 that transmits a remote signal from the controller 24 to a user of a radiotelephone. The controller 24 is also electrically connected to a microphone 28 that receives a voice signal from a user and transmits the voice signal through the controller 24 and transceiver 22 to a remote device. The controller 24 is electrically connected to a keypad 30 and display 32 that facilitate radiotelephone operation. Other elements of radiotelephones are conventional and need not be described herein.

Figure 3A:
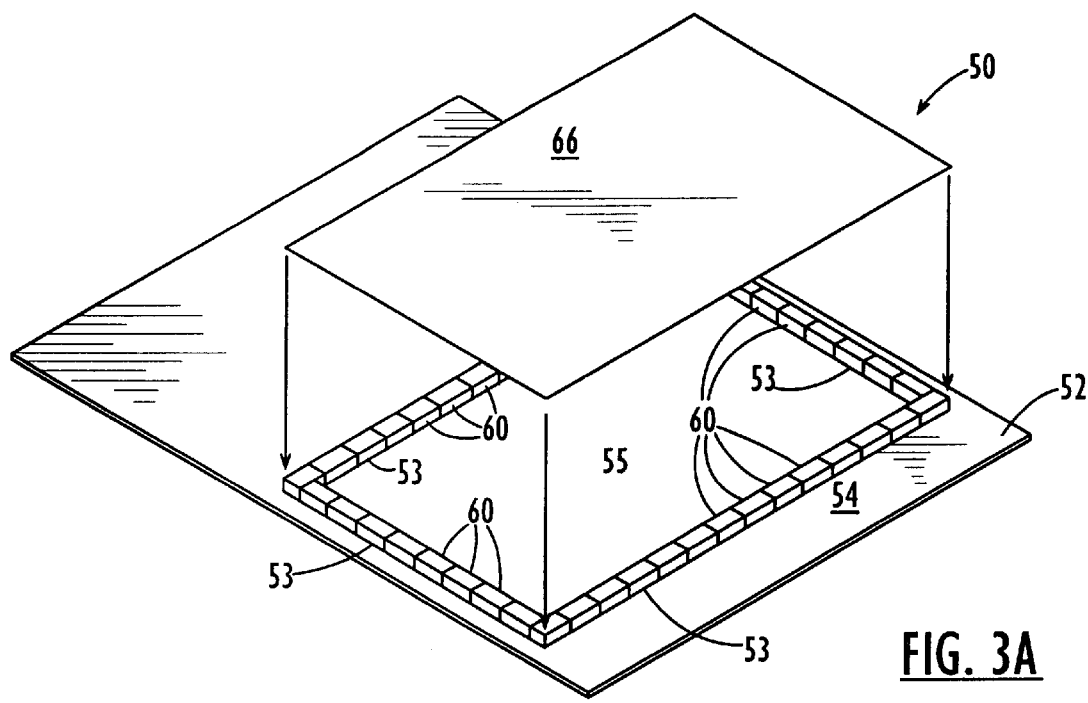
FIG. 3A is perspective view of a shielding apparatus including a plurality of electrically conductive block members electrically secured to a ground plane and a top conductively attached to the block members, according to an embodiment of the present invention.

Referring now to FIG. 3A, a perspective view of an electromagnetic shielding apparatus 50 according to an embodiment of the present invention that can be used to shield electronic components or circuitry mounted on (or embedded within) an electronic substrate, such as a PCB, is illustrated. The illustrated electromagnetic shielding apparatus 50 can be utilized within various electronic devices, and is particularly configured for use within small electronic devices, such as radiotelephones.

The illustrated electromagnetic shielding apparatus 50 includes an electronic substrate 52, such as a printed circuit board (PCB), that serves as a ground plane. In the illustrated embodiment, the electronic substrate 52 has a conductive trace 53 extending along a surface 54 of the electronic substrate 52. The conductive trace 53 defines a perimeter of an area 55 of the electronic substrate 52 to be shielded. Although not illustrated, it is understood that various electronic components and/or circuitry are located within the shielded area 55. The illustrated electronic substrate 52, may be a PCB that is utilized within an electronic device such as a radiotelephone.

A plurality of electrically conductive block members 60 are electrically secured to the ground trace 53 in adjacent relationship, as illustrated in FIG. 3A. Preferably, each block member 60 is secured to the ground trace 53 via solder. However, electrically conductive adhesive may also be utilized. Each block member 60 is preferably formed from conductive material. Exemplary conductive materials include, but are not limited to, copper, aluminum, gold, silver, as well as alloys of copper, aluminum, gold, and silver. Preferably, each block member 60 is solid. Solid block members 60 can be good thermal conductors that act as small heat sinks within an electronic device. As a result, block members according to the present invention may facilitate dissipating heat from and/or controlling heat build-up within electronic devices such as radiotelephones.

However, it is understood that the present invention is not limited to solid block members 60. Various multi-material implementations of block members 60 may be utilized without limitation. Exemplary multi-material implementations include, but are not limited to, solder coated copper, nickel plated steel, and metalized plastic.

Figure 3B:
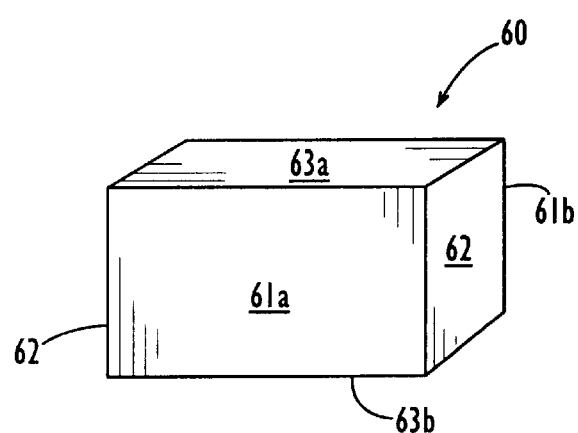
FIG. 3B is perspective view of a conductive block member according to an embodiment of the present invention.

Each block member in the illustrated embodiment of FIG. 3A includes opposite front and back faces 61a, 61b, a pair of opposite side faces 62, and generally parallel top and bottom faces 63a, 63b, as illustrated in greater detail in FIG. 3B. In the illustrated embodiment, the side faces 62 of each block member 60 are generally parallel. In addition, the front and back faces 61a, 61b of each block member 60 are also generally parallel. However, it is understood that the side faces 62 and front and back faces 61a, 61b of each block member 60 need not be parallel. The front and back faces 61a, 61b, top and bottom faces 63a, 63b, and side faces 62 may have various non-planar configurations.

Exemplary dimensions for the front and back faces 61a, 61b are 2 millimeters (mm) in width by 4 mm in height. Exemplary dimensions for the side faces 62 are 1.6 mm in width by 4 mm in height. However, block members 60 according to the present invention may have various dimensions and are not limited to these exemplary dimensions. Furthermore, block members 60 according to the present invention may have various shapes and configurations and are not limited to the illustrated rectangular embodiment. For example, various surfaces of a block member 60 may have convex and/or concave configurations.

Preferably, adjacent block members 60 are in contacting relationship. However, adjacent block members 60 may have a gap therebetween. As would be understood by those skilled in the art of RF shielding, sufficient RF shielding may occur as long as any gaps in a shielding device have a dimension smaller than the length of the wavelength of the RF radiation being shielded.

Figure 4:
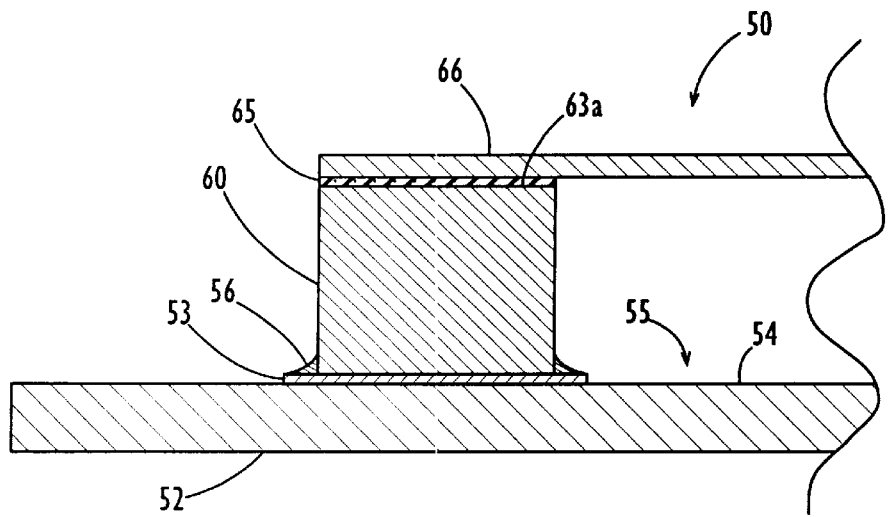
FIG. 4 is an enlarged side view of the shielding apparatus of FIG. 3A illustrating a block member soldered to a PCB and the cover adhesively secured to the block member.

Referring to FIG. 4, each block member 60 is electrically connected to the conductive trace 53 on the PCB surface 54 via solder 56 to define a perimeter of an area 55 to be shielded. An electrically conductive cover 66 is electrically secured to the top face 63a of each of the block members 60 so as to overlie the area 55 of the electronic surface 54 to be shielded and to thereby define an enclosure 50 that shields the area 55 and any electronic components and/or circuitry therewithin. The cover 66 is secured to the top face 63a of each block member via an electrically conductive adhesive (or via solder) 65. The cover 66 may be formed from conductive material including, but not limited to, copper, aluminum, gold, silver, as well as alloys of copper, aluminum, gold, and silver. In addition, the cover 66 may be formed from metalized polymeric material.

The illustrated electromagnetic shielding apparatus 50 can be particularly advantageous for use during the development stages of electronic devices. Block members 60 can be placed on a PCB surface as the PCB is being populated with electronic components. The block members 60 can then be soldered to the PCB along with the electronic components. Soldering techniques which permit multiple components to be soldered to a PCB at the same time are well known to those skilled in this art and need not be described further herein. Block members 60 can be easily moved and relocated as adjustments are made to the location of electronic components. Covers 66 can be easily fabricated and secured to the block members 60.

Figure 5:
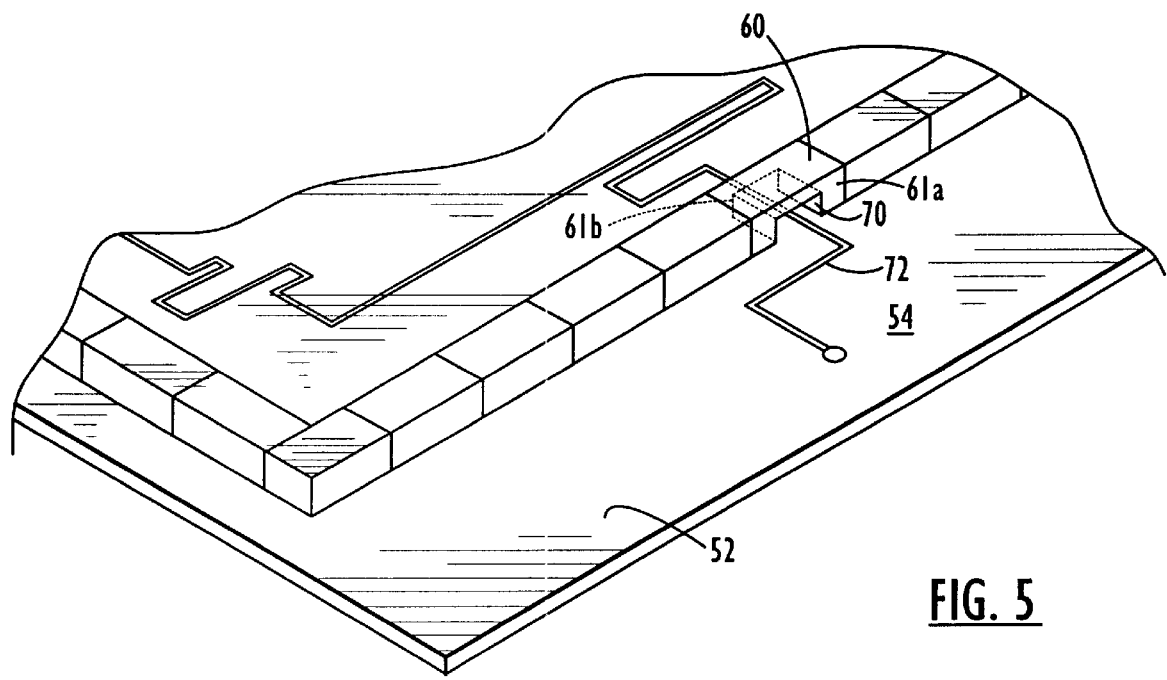
FIG. 5 is an enlarged, perspective view of the shielding apparatus of FIG. 3A illustrating a passageway in a block member that permits a conductive trace to pass therethrough according to an embodiment of the present invention.

Referring now to FIG. 5, a block member 60 according to another embodiment of the present invention is illustrated. The illustrated block member 60 has a groove 70 formed in the bottom face 63b thereof. The groove 70 extends between the front and back faces 61a, 61b and enables a conductive trace 72 to extend along the surface 54 of the electronic substrate 52 and through the block member 60 without contacting the block member 60. This embodiment of the present invention can be particularly advantageous because conductive traces can be routed out from a shielded area of a PCB.

Electronic devices, such as computers, may use various peripheral devices to increase flexibility and adaptability to various work environments. This may be especially true for computing devices such as hand-held computer terminals, lap-top computers, and vehicle mounted computing devices. The Personal Computer Memory Card International Association (PCMCIA) was formed by several memory card manufacturers in the late 1980s to define memory card physical design, computer socket design, electrical interface, and associated software (referred to as the PCMCIA interface standard).

Memory cards complying with the PCMCIA interface standard (hereinafter "IPCMCIA cards") are relatively small, having a length and width roughly the size of a credit card. PCMCIA cards are designed to slide into a receiving slot of a computing device. At one end of a PCMCIA card is an interface section which is in essence a female portion of a connector that mates with a male end in a receiving device (e.g., a computer).

The success of interchangeable PCMCIA memory cards has led to the development of other types of peripheral devices using the PCMCIA interface standard. These devices include modems, sound cards, floppy disk controllers, hard drives, Global Positioning System (GPS) cards, local area network (LAN) cards, pagers, and radiotelephone cards. For example, a PCMCIA radiotelephone card may be inserted into the same PCMCIA interface of a computer as other PCMCIA devices.

Figure 6:
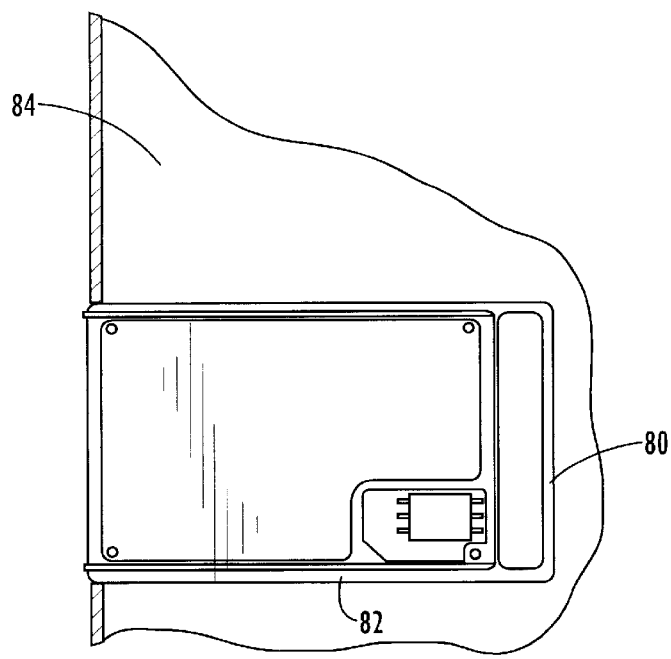
FIG. 6 illustrates an exemplary PCMCIA card inserted within a computing device.

FIG. 6 illustrates an exemplary radiotelephone card 80 located within a PCMCIA slot 82 of an electronic device 84. As is understood by those skilled in the art, the radiotelephone card 80 functions as a radiotelephone transceiver for transmitting and receiving radiotelephone communications.

Figure 7:
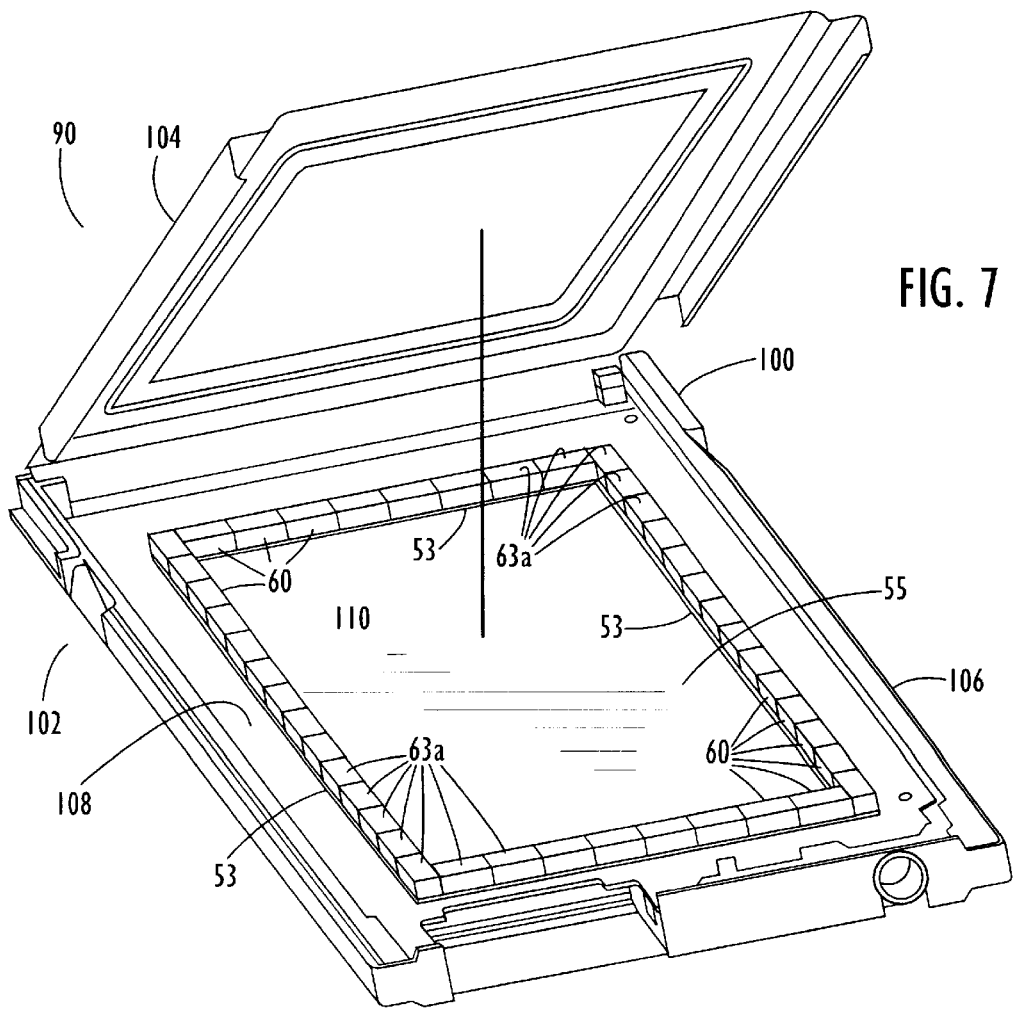
FIG. 7 illustrates a shielding apparatus within a PCMCIA card according to an embodiment of the present invention.

Referring now to FIG. 7, an electromagnetic shielding apparatus 90 according to another embodiment of the present invention is illustrated. The illustrated electromagnetic shielding apparatus 90 is incorporated within a PCMCIA card 100. The illustrated PCMCIA card 100 includes a housing 102 that has an electrically conductive cover 104 and a base 106. A PCB 108 is disposed within the housing 102, as illustrated. In the illustrated embodiment of FIG. 7, the cover 104 is open so as to expose the PCB 108 disposed within the housing 102.

The illustrated PCB 108 serves as a ground plane and has a conductive trace 53 extending along a surface 110 thereof. The conductive trace 53 defines a perimeter of an area 55 of the PCB 108 to be shielded. Although not illustrated, it is understood that various electronic components and/or circuitry are located within the shielded area 55. A plurality of electrically conductive block members 60 are electrically secured to the conductive trace 53 in adjacent relationship, as illustrated.

The cover 104 of the PCMCIA card housing 102 is configured to be electrically connected via conductive adhesive to the top face 63a of each of the block members 60. Accordingly, the electrically conductive cover 104 combined with the plurality of block members 60 and the PCB 108 serves as an electromagnetic shielding apparatus 90 for shielding electronic components and/or circuitry within the shielded area 55.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. An electromagnetic shielding apparatus, comprising:
    a ground plane including a surface;
    a plurality of detached, electrically conductive block members, wherein each detached block member is electrically connected to the ground plane surface in adjacent relationship to define a perimeter of an area of the ground plane surface to be shielded, wherein each detached, electrically conductive block member includes opposite front and back faces, a pair of opposite side faces, and top and bottom faces, wherein at least one of the detached, electrically conductive block members comprises a groove in a bottom face thereof, wherein the groove extends between the front and back faces of the at least one detached, electrically conductive block member, and wherein a conductive trace extends along the ground plane surface through the groove and across the perimeter of the shielded area; and
    an electrically conductive cover secured to the top face of each of the detached, electrically conductive block members to overlie the area of the ground plane to be shielded.

2. An electromagnetic shielding apparatus according to claim 1 wherein the side faces of each detached, electrically conductive block member are generally parallel and wherein the top and bottom faces of each detached, electrically conductive block member are generally parallel.

3. An electromagnetic shielding apparatus according to claim 1 wherein the front and back faces of each detached, electrically conductive block member are generally parallel.

4. An electromagnetic shielding apparatus according to claim 1 wherein a gap between adjacent detached, electrically conductive block members is between 0.0 millimeters and 0.5 millimeters.

5. An electromagnetic shielding apparatus according to claim 1 wherein the detached, electrically conductive block members are in adjacent contacting relationship.

6. An electromagnetic shielding apparatus according to claim 1 wherein the cover is secured to the top face of each detached, electrically conductive block member via an electrically conductive adhesive.

7. An electromagnetic shielding apparatus according to claim 1 wherein each detached, electrically conductive block member comprises material selected from the group consisting of copper, copper alloy, aluminum, aluminum alloy, gold, gold alloy, silver, silver alloy, solder coated copper, nickel plated steel, and metalized polymer.

8. An electromagnetic shielding apparatus according to claim 1 wherein the cover comprises metalized polymeric material.

9. An electromagnetic shielding apparatus, comprising:

an electronic substrate that includes a surface and a ground trace extending along the surface to define a perimeter of an area of the electronic substrate to be shielded;

a plurality of detached, electrically conductive block members, wherein each detached member is electrically secured to the ground trace in adjacent relationship, wherein each detached block member includes opposite front and back faces, a pair of opposite side faces, and top and bottom faces, and wherein adjacent detached block members are separated by a distance of between 0.0 millimeters and 0.5 millimeters, wherein at least one of the detached, electrically conductive block members comprises a groove in a bottom face thereof, wherein the groove extends between the front and back faces of the at least one detached, electrically conductive block member, and wherein a conductive trace extends along the ground plane surface through the groove and across the perimeter of the shielded area; and an electrically conductive cover electrically secured to the top face of each of the detached block members to overlie the area of the electronic surface to be shielded.

10. An electromagnetic shielding apparatus according to claim 9 wherein the side faces of each detached block member are generally parallel and wherein the top and bottom faces of each detached block member are generally parallel.

11. An electromagnetic shielding apparatus according to claim 9 wherein the front and back faces of each detached block member are generally parallel.

12. An electromagnetic shielding apparatus according to claim 9 wherein each detached block member is secured to the ground trace via an electrically conductive adhesive.

13. An electromagnetic shielding apparatus according to claim 9 wherein each detached block member is secured to the ground trace via solder.

14. An electromagnetic shielding apparatus according to claim 9 wherein the cover is secured to the top face of each detached block member via an electrically conductive adhesive.

15. An electromagnetic shielding apparatus according to claim 9 wherein each detached block member comprises material selected from the group consisting of copper, copper alloy, aluminum, aluminum alloy, gold, gold alloy, silver, silver alloy, solder coated copper, nickel plated steel, and metalized polymer.

16. An electromagnetic shielding apparatus according to claim 9 wherein the cover comprises metalized polymeric material.

17. An electronic apparatus, comprising:

an electronic substrate that includes a surface and a ground trace extending along the surface to define a perimeter of an area of the electronic substrate to be shielded; and an electromagnetic shielding apparatus secured to the electronic substrate surface, comprising:

a plurality of detached, electrically conductive block members electrically secured to the ground trace in adjacent relationship, wherein each detached block member includes opposite front and back faces, a pair of opposite side faces, and top and bottom faces, wherein at least one of the detached, electrically conductive block members comprises a groove in a bottom face thereof, wherein the groove extends between the front and back faces of the at least one detached, electrically conductive block member, and wherein a conductive trace extends along the ground plane surface through the groove and across the perimeter of the shielded area; and an electrically conductive cover electrically secured to the top face of each of the detached block members to overlie the area of the electronic surface to be shielded.

18. An electronic apparatus according to claim 17 wherein the side faces of each detached block member are generally parallel and wherein the top and bottom faces of each detached block member are generally parallel.

19. An electronic apparatus according to claim 17 wherein the front and back faces of each detached block member are generally parallel.

20. An electronic apparatus according to claim 17 wherein a gap between adjacent detached block members is between 0.0 millimeters and 0.5 millimeters.

21. An electronic apparatus according to claim 17 wherein the detached block members are in adjacent contacting relationship.

22. An electronic apparatus according to claim 17 wherein each detached block member is secured to the ground trace via an electrically conductive adhesive.

23. An electronic apparatus according to claim 17 wherein each detached block member is secured to the ground trace via solder.

24. An electronic apparatus according to claim 17 wherein the cover is secured to the top face of each detached block member via an electrically conductive adhesive.

25. An electronic apparatus according to claim 17 wherein each detached block member comprises material selected from the group consisting of copper, copper alloy, aluminum, aluminum alloy, gold, gold alloy, silver, silver alloy, solder coated copper, nickel plated steel, and metalized polymer.

26. An electronic apparatus according to claim 17 wherein the cover comprises metalized polymeric material.

27. An electronic apparatus according to claim 17 wherein the electronic apparatus is a radiotelephone.

28. A Personal Computer Memory Card International Association (PCMCIA) card comprising:

a housing including an electrically conductive cover;

a printed circuit board (PCB) disposed within the housing, wherein the PCB includes a surface and a ground trace extending along the surface to define a perimeter of an area of the PCB to be shielded; and a plurality of detached, electrically conductive block members electrically secured to the ground trace in adjacent relationship, wherein each detached block member includes opposite front and back faces, a pair of opposite side faces, and top and bottom faces, wherein the housing cover is electrically secured to the top face of each of the detached block members, and wherein at least one of the detached, electrically conductive block members comprises a groove in a bottom face thereof, wherein the groove extends between the front and back faces of the at least one detached, electrically conductive block member, and wherein a conductive trace extends along the ground plane surface through the groove and across the perimeter of the shielded area.

29. A PCMCIA card according to claim 28 wherein the side faces of each detached block member are generally parallel and wherein the top and bottom faces of each detached block member are generally parallel.

30. A PCMCIA card according to claim 28 wherein the front and back faces of each detached block member are generally parallel.

31. A PCMCIA card according to claim 28 wherein a gap between adjacent detached block members is between 0.0 millimeters and 0.5 millimeters.

32. A PCMCIA card according to claim 28 wherein the detached block members are in adjacent contacting relationship.

33. A PCMCIA card according to claim 28 wherein each detached block member is secured to the ground trace via an electrically conductive adhesive.

34. A PCMCIA card according to claim 28 wherein each detached block member is secured to the ground trace via solder.

35. A PCMCIA card according to claim 28 wherein the cover is secured to the top face of each detached block member via an electrically conductive adhesive.

36. A PCMCIA card according to claim 28 wherein each detached block member comprises material selected from the group consisting of copper, copper alloy, aluminum, aluminum alloy, gold, gold alloy, silver, silver alloy, solder coated copper, nickel plated steel, and metalized polymer.

37. A PCMCIA card according to claim 28 wherein the PCMCIA card is a radiotelephone card.

38. An electronic device, comprising:

a housing;

a peripheral device slot within said housing, said peripheral device slot comprising a peripheral device interface;

a peripheral device card removably secured within the peripheral device slot such that the peripheral device card is electrically connected to the peripheral device interface, wherein the peripheral device card comprises:

a housing including an electrically conductive cover;

a printed circuit board (PCB) disposed within the housing, wherein the PCB includes a surface and a ground trace extending along the surface to define a perimeter of an area of the PCB to be shielded; and a plurality of detached, electrically conductive block members, wherein each detached member is electrically secured to the ground trace in adjacent relationship, wherein each detached block member includes opposite front and back faces, a pair of opposite side faces, and top and bottom faces, wherein the housing cover is electrically secured to the top face of each of the detached block members, and wherein at least one of the detached, electrically conductive block members comprises a groove in a bottom face thereof, wherein the groove extends between the front and back faces of the at least one detached, electrically conductive block member, and wherein a conductive trace extends along the ground plane surface through the groove and across the perimeter of the shielded area.

39. An electronic device according to claim 38 wherein the side faces of each detached block member are generally parallel and wherein the top and bottom faces of each detached block member are generally parallel.

40. An electronic device according to claim 38 wherein the front and back faces of each detached block member are generally parallel.

41. An electronic device according to claim 38 wherein a gap between adjacent detached block members is between 0.0 millimeters and 0.5 millimeters.

42. An electronic device according to claim 38 wherein the detached block members are in adjacent contacting relationship.

43. An electronic device according to claim 38 wherein each detached block member is secured to the ground trace via an electrically conductive adhesive.

44. An electronic device according to claim 38 wherein each detached block member is secured to the ground trace via solder.

45. An electronic device according to claim 38 wherein the cover is secured to the top face of each detached block member via an electrically conductive adhesive.

46. An electronic device according to claim 38 wherein each detached block member comprises material selected from the group consisting of copper, copper alloy, aluminum, aluminum alloy, gold, gold alloy, silver, silver alloy, solder coated copper, nickel plated steel, and metalized polymer.

47. An electronic device according to claim 38 wherein the peripheral device card comprises a radiotelephone transceiver.

48. An electronic device according to claim 38 wherein said electronic device comprises a data processor.

49. An electronic device according to claim 38 wherein said peripheral device interface is a PCMCIA interface and wherein said peripheral device card is a PCMCIA card.

* * * * *